(12) United States Patent
Ciubotaru

(10) Patent No.: US 10,564,217 B2
(45) Date of Patent: Feb. 18, 2020

(54) BUILT-IN SELF-TEST METHOD AND APPARATUS FOR SINGLE-PIN CRYSTAL OSCILLATORS

(71) Applicant: Arm Limited, Cambridge (GB)

(72) Inventor: Alexandru Aurelian Ciubotaru, Coconut Creek, FL (US)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 15/979,995

(22) Filed: May 15, 2018

(65) Prior Publication Data

US 2019/0353699 A1 Nov. 21, 2019

(51) Int. Cl.
 *G01R 31/02* (2006.01)
 *H03B 5/36* (2006.01)
 *H03K 3/0231* (2006.01)
 *G01R 31/28* (2006.01)
 *H03K 4/00* (2006.01)

(52) U.S. Cl.
 CPC ....... *G01R 31/2884* (2013.01); *G01R 31/028* (2013.01); *G01R 31/2824* (2013.01); *H03B 5/364* (2013.01); *H03K 3/0231* (2013.01); *H03K 4/00* (2013.01)

(58) Field of Classification Search
 CPC .. G01R 27/26; G01R 27/2605; G01R 31/028; G01R 31/26; G01R 31/27; G01R 31/275; G01R 31/2824; G01R 31/2884; G01R 31/31727; H03B 5/30; H03B 5/32; H03B 5/36; H03B 5/362; H03B 5/364; H03B 5/368; H03K 3/0231; H03K 4/12; H03K 4/50

USPC .......................................................... 331/44
See application file for complete search history.

(56) References Cited

U.S. PATENT DOCUMENTS

| | | | | |
|---|---|---|---|---|
| 4,187,460 | A * | 2/1980 | Dauge | G01R 19/252 324/607 |
| 4,720,689 | A * | 1/1988 | Gontowski, Jr. | H03K 3/0231 331/111 |
| 6,348,806 | B1 * | 2/2002 | Okandan | G01R 31/2621 324/750.3 |
| 6,653,908 | B1 | 11/2003 | Jones | |
| 6,798,301 | B1 | 9/2004 | Balan et al. | |
| 6,909,336 | B1 | 6/2005 | Rajagopalan et al. | |
| 7,307,485 | B1 * | 12/2007 | Snyder | G01R 27/2605 324/548 |
| 7,411,462 | B2 | 8/2008 | Wallberg et al. | |

(Continued)

OTHER PUBLICATIONS

K. Arabi and B. Kaminska, "Oscillation built-in self test (OBIST) scheme for functional and structural testing of analog and mixed-signal integrated circuits," Proceedings International Test Conference 1997, Washington, DC, 1997, pp. 786-795.

(Continued)

*Primary Examiner* — Levi Gannon
(74) *Attorney, Agent, or Firm* — Leveque IP Law, P.C.

(57) ABSTRACT

A built-in self-test (BIST) methodology and apparatus provide for testing and calibration of an integrated circuit oscillator circuit topology that uses a one-pin (a single-pin) external resonator. The method employs dedicated test circuitry, also referred to herein as BIST apparatus, for the pass/fail verification of both the active and passive building blocks of the oscillator. At the same time, the methodology ensures accurate calibration and matching of the capacitors using dedicated digital circuitry and algorithms.

21 Claims, 10 Drawing Sheets

(56) References Cited

U.S. PATENT DOCUMENTS

| | | | |
|---|---|---|---|
| 7,472,322 B1 | 12/2008 | Ma et al. | |
| 7,941,723 B1 | 5/2011 | Lien et al. | |
| 7,999,628 B2 | 8/2011 | Miyashita | |
| 8,067,948 B2* | 11/2011 | Sequine | G01D 5/24 |
| | | | 324/678 |
| 8,179,294 B2 | 5/2012 | Karthaus et al. | |
| 8,519,722 B1* | 8/2013 | Prendergast | G06F 3/044 |
| | | | 324/658 |
| 10,236,900 B1* | 3/2019 | Loveless | H03M 1/1071 |
| 2005/0099198 A1* | 5/2005 | Puma | G01R 31/27 |
| | | | 324/750.3 |
| 2005/0212614 A1 | 9/2005 | Peluso | |
| 2007/0262963 A1* | 11/2007 | Xiao-Ping | G06F 3/03547 |
| | | | 345/173 |
| 2012/0161889 A1 | 6/2012 | Ozawa et al. | |
| 2012/0293270 A1 | 11/2012 | Zhang et al. | |
| 2014/0091815 A1* | 4/2014 | Suwald | G01R 27/2605 |
| | | | 324/658 |

OTHER PUBLICATIONS

S. R. Das et al., "Testing Analog and Mixed-Signal Circuits With Built-In Hardware—A New Approach," in IEEE Transactions on Instrumentation and Measurement, vol. 56, No. 3, pp. 840-855, Jun. 2007.

Stroud, C.E., 'A Designer's Guide to Built-In Self-Test', Kluwer, 2002, Ch. 1.

J. A. T. M. van den Homberg, "A universal 0.03-mm2 one-pin crystal oscillator in CMOS," in IEEE Journal of Solid-State Circuits, vol. 34, No. 7, pp. 956-961, Jul. 1999.

Vittoz, E., 'Low-Power Crystal and MEMS Oscillators', Springer, 2010, Ch. 6.

* cited by examiner

US 10,564,217 B2

BUILT-IN SELF-TEST METHOD AND APPARATUS FOR SINGLE-PIN CRYSTAL OSCILLATORS

CROSS-REFERENCE TO RELATED APPLICATIONS

This application is related to the following U.S. patent applications: application Ser. No. 15/980,058, entitled "BUILT-IN SELF-TEST METHOD AND APPARATUS FOR SINGLE-PIN CRYSTAL OSCILLATORS," filed on even date herewith, which is incorporated herein in its entirety.

BACKGROUND

Modern clocking circuits in integrated circuits require stable frequency references (oscillators) with fast turn-on, small output noise, and small power consumption. Because of stringent frequency stability requirements, an external resonator with a high-quality factor (such as a quartz crystal) is usually employed in conjunction with active components in the integrated circuit for generating the reference oscillations. However, because the number of pins available in an integrated circuit for interfacing with other external circuits is limited, it is advantageous to use only one pin for connecting the resonator. Although only one pin is used for the resonator itself, high-performance oscillator architectures usually employ two capacitors that form part of a positive feedback path and a negative feedback path, respectively, such as in the case of the van den Homberg oscillator. The two capacitances associated with these two feedback paths must be precisely matched for good oscillator performance, which presents unique challenges with respect to testing and calibration. This testing and calibration must occur before the normal start-up of the oscillator.

If a capacitance on the reference/internal side of the oscillator, for example, is larger than the capacitance on the load/crystal/external side, then the oscillator is unstable, in the sense that an oscillation is possible at a frequency much different from the resonator frequency. Conversely, if the reference capacitance is correctly smaller than the load capacitance, which ensures operation at the desired resonant frequency, but the ratio of their values is not sufficiently close to 1, then the oscillator start-up time increases, which is also undesirable. Additional challenges are presented by the unavailability of proper stimuli and/or circuitry for their application in complex systems such as integrated receivers, transmitters, and transceivers, and by the low-supply-voltage environments in which active devices (such as transistors) must operate with small headroom voltages to stay within specification.

Therefore, there is currently a need in the art for properly calibrating the capacitances of an oscillator, such as a single-pin crystal oscillator, while also independently assessing the health of the oscillator's building blocks such as programmable oscillator capacitor blocks and active circuitry.

BRIEF DESCRIPTION OF THE DRAWINGS

The accompanying drawings provide visual representations which will be used to more fully describe various representative embodiments and can be used by those skilled in the art to better understand the representative embodiments disclosed and their inherent advantages. In these drawings, like reference numerals identify corresponding elements.

DETAILED DESCRIPTION

Figure 1:
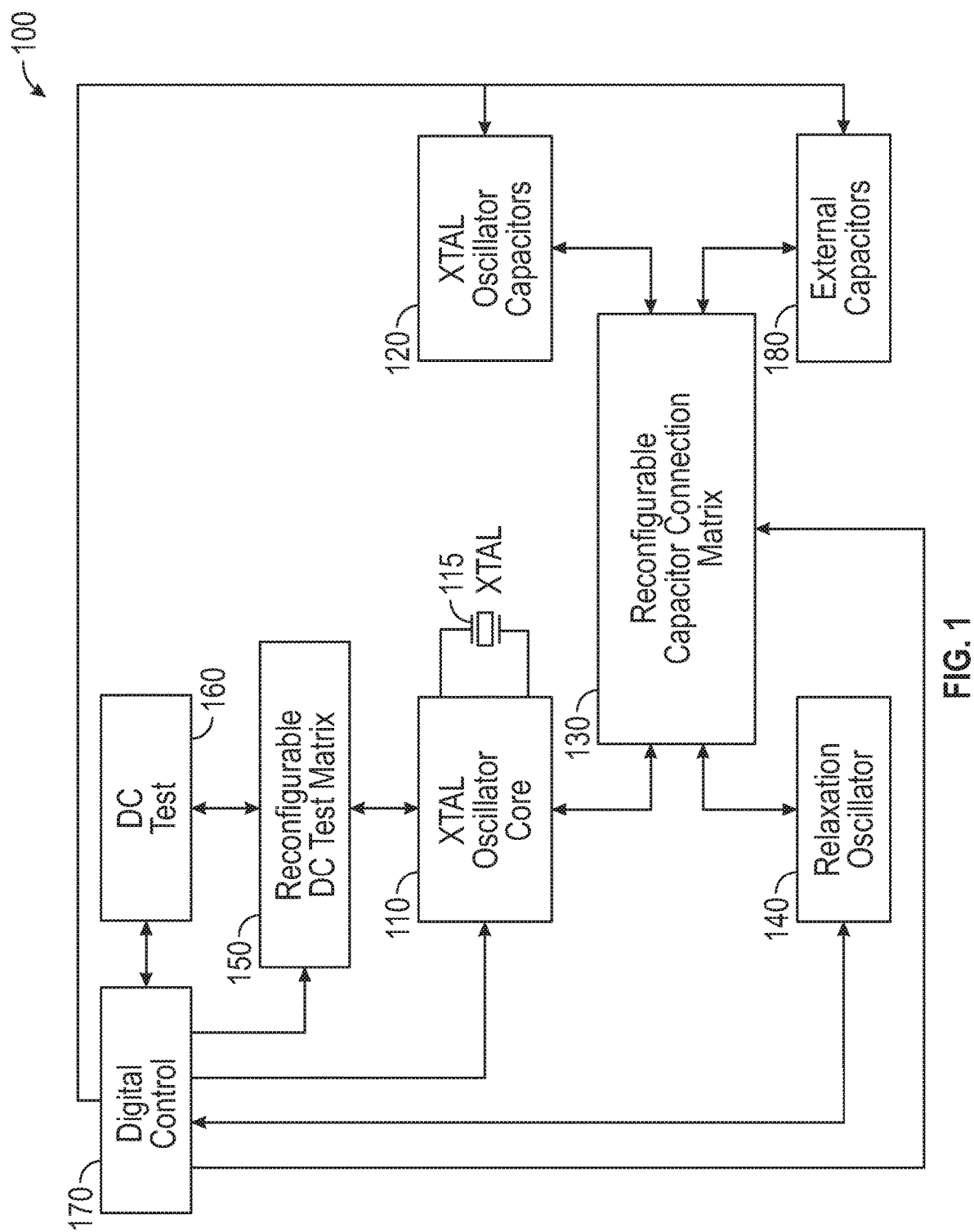
FIG. 1 is a diagram that illustrates an embodiment of a BIST architecture for a crystal oscillator circuit under test, in accordance with various representative embodiments.

The disclosure relates to the field of testing and calibration of integrated circuits, and in particular to the testing and calibration of integrated circuit oscillators.

One way to ensure the correct operation of a crystal oscillator in a complex integrated communication system, or to troubleshoot a faulty oscillator unit, is to verify the correct operation of its individual components. In accordance with the various embodiments provided herein, this verification can be performed using dedicated test circuitry not normally associated with the main oscillator. The dedicated test circuitry is connected to the main oscillator at the time of the testing and disconnected during normal oscillator operation.

This selective connection can be realized by digitally-controlled switches that can be grouped into more complex structures and therefore provide circuit reconfiguration, for selectively connecting the desired oscillator components (such as programmable oscillator capacitors, or components of the active core of the oscillator) to the test circuitry. The test circuitry itself can comprise circuit blocks that, when associated with portions of the oscillator under test, either generate or permit access to signals that are relevant to the testing process. The digital control for the required reconfiguration and testing functions can be integrated with the main digital section of the system. The embodiments described herein are clearly applicable to communication systems, as well as to any system or circuit that uses a frequency reference that is provided by a crystal oscillator.

A built-in self-test (BIST) methodology and apparatus provide for testing and calibration of an integrated circuit oscillator circuit topology that uses a one-pin (a single-pin) external resonator. The method employs dedicated test circuitry, also referred to herein as BIST apparatus, for the pass/fail verification of both the active building blocks of the oscillator (such as transconductors, operational transconductance amplifiers (OTA), and other types of oscillator amplifiers, all of which are made up of active components such as transistors) and the passive building blocks (such as digitally-programmable oscillator capacitor banks). At the same time, in the case of oscillators whose operation relies on matched oscillator capacitors, the method ensures accurate calibration and matching of the capacitors using dedicated digital circuitry and algorithms. Correct digital tuning of the oscillator in normal operation is achieved by properly accounting for and compensating for inherent parasitic capacitance due to packaging, printed-circuit-board (PCB) routing, or electrostatic-discharge (ESD) protection circuitry.

The apparatus associated with the method presented herein can also accommodate the testing of other on-chip components (such as capacitor banks) associated with other blocks present in the integrated circuit under test, via a component selection block consisting primarily of digitally-controlled switches. The apparatus can also accommodate (such as by means of digitally-controlled switches) the testing of different aspects associated with the same active blocks of the oscillator (e.g., a common-mode voltage or a differential voltage), by selectively connecting the testing circuitry to different nodes of interest in the circuit under test. In normal operation, the BIST circuit is disconnected from the main circuit and does not interfere with the oscillator core. Internal circuit implementations of the different blocks of the BIST apparatus, relevant to low-voltage integrated circuits, are also disclosed.

An advantage of the disclosed BIST method and apparatus is minimally-invasive and efficient testing of the main building blocks of an oscillator and their correct operation when simultaneously engaged, while ensuring the correct tuning of two-capacitor topologies in cases where one or both of the oscillator capacitors is affected by imprecise parasitics.

Accordingly, in accordance with certain representative embodiments of the present disclosure, there is provided a BIST method for testing an integrated circuit oscillator circuit topology by testing functionality of one or more programmable oscillator capacitors of an oscillator of an integrated circuit, the method comprising: placing an oscillator core of the oscillator into a high-impedance mode, the oscillator core coupled to one or more of the programmable oscillator capacitors via a reconfigurable capacitor connection matrix; and measuring the frequency of a relaxation oscillator as a function of programming codes applied to the programmable oscillator capacitors via the reconfigurable capacitor connection matrix. The relaxation oscillator is coupled to the programmable oscillator capacitors by the reconfigurable capacitor connection matrix.

There is additionally provided a BIST apparatus having a reconfigurable capacitor connection matrix; a relaxation oscillator, operable to generate a frequency different from a frequency generated by an oscillator of the integrated circuit, the relaxation oscillator coupled to one or more programmable oscillator capacitors of the oscillator and an oscillator core of the oscillator via the reconfigurable capacitor connection matrix and an output of the relaxation oscillator coupled to the reconfigurable capacitor connection matrix; and a control element coupled to and operable to control the reconfigurable capacitor connection matrix and the relaxation oscillator. Functionality of one or more of the programmable oscillator capacitors of the oscillator is tested by placement of the oscillator core of the integrated circuit into a high-impedance mode by the control element and measurement of the frequency of the relaxation oscillator as a function of programming codes applied to the programmable oscillator capacitors by the reconfigurable capacitor connection matrix.

While this disclosure is susceptible of embodiment in many different forms, there is shown in the drawings and will herein be described in detail specific embodiments, with the understanding that the present disclosure is to be considered as an example of the principles of the invention and not intended to limit the disclosure to the specific embodiments shown and described. In the description below, like reference numerals are used to describe the same, similar or corresponding parts in the several views of the drawings.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

Reference throughout this document to "one embodiment", "certain embodiments", "an embodiment" or similar terms means that a particular feature, structure, or characteristic described in connection with the embodiment is included in at least one embodiment of the present disclosure. Thus, the appearances of such phrases or in various places throughout this specification are not necessarily all referring to the same embodiment. Furthermore, the particular features, structures, or characteristics may be combined in any suitable manner in one or more embodiments without limitation.

The term "or" as used herein is to be interpreted as an inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

For simplicity and clarity of illustration, reference numerals may be repeated among the figures to indicate corresponding or analogous elements. Numerous details are set forth to provide an understanding of the embodiments described herein. The embodiments may be practiced without these details. In other instances, well-known methods, procedures, and components have not been described in detail to avoid obscuring the embodiments described. The description is not to be considered as limited to the scope of the embodiments described herein.

Referring now to FIG. 1, an embodiment of a BIST architecture for a generic crystal oscillator circuit under test using reconfigurable connection matrices and a dedicated relaxation oscillator is shown. The block diagram 100 illustrates BIST architecture comprising an oscillator core (crystal (XTAL) oscillator core 110) and capacitors (XTAL oscillator capacitors 120). Using a digitally-controlled reconfigurable capacitor connection matrix 130, the programmable crystal oscillator capacitors 120 are connected to a relaxation oscillator 140 that generates a signal at a frequency different from the frequency of the crystal oscillator determined by crystal resonator XTAL 115. The frequency of the oscillator resonator is much higher than the signal generated by the relaxation oscillator and the frequency of the resonator used can vary widely; the crystal resonator can be anything approximately 10 MHz to approximately 50 MHz. For example, if the frequency of the XTAL oscillator resonator 115 is 32 MHz, the frequency of the relaxation oscillator 140 can be on the order of 1 MHz. The correct operation and functionality of each of the oscillator capacitors 120 (shown as C1, C2 in FIGS. 2-7) is tested by recording the frequency of the relaxation oscillator as a function of a programming code applied to the programmable oscillator capacitors 120, known as a capacitance programming code, capacitance code, capacitor code, digital capacitor code or the like. During this test, the crystal oscillator core 110 is put in high-impedance (high-Z) mode to eliminate any interference from other circuit components. Capacitors external to the crystal oscillator under test (e.g., associated with another on-chip crystal oscillator, such as those found in FIGS. 6, 7, and 9, for example) can also be tested in this way, simply by connecting them to the same relaxation oscillator 140 via the reconfigurable capacitor connection matrix 130 and repeating the above procedure. Such capacitors external to and distinct from the programmable oscillator capacitors 120 associated with the oscillator under test may be denoted herein as Cext, Ctest, a second plurality of programmable oscillator capacitors (as opposed to a first plurality of programmable oscillator capacitors 120 that together with the oscillator core 110 and resonator 115 make up with an oscillator under test), or the like.

Further, using a digitally-controlled reconfigurable DC test matrix 150, the DC bias voltages associated with the crystal oscillator core 110 (the active portion of the oscillator circuit) are evaluated for correctness in a DC test block 160, which provides a measure of health for the active portion of the oscillator. During the DC test, some or all of the oscillator capacitors 120 are set to their maximum values via the control element 170, shown here as digital control 170 though the control is not required to be digital control, for inhibiting the generation of any oscillations that would otherwise occur. As will be described, this includes setting some or all of the capacitors of the oscillator capacitor banks, such as the van den Homberg oscillator capacitor banks C1, C2 shown in FIG. 2, to their maximum value and also may preferably include setting to their maximum value some or all of the external capacitors 180 of the IC not affiliated with the programmable oscillator capacitors 120. So long as the loop gain is less than 1, oscillation of the crystal oscillator 115 is inhibited. Further, as previously mentioned, the digital control for the required reconfiguration and testing functions can be integrated with the main digital section of the system or it may be provided more locally.

Figure 2:
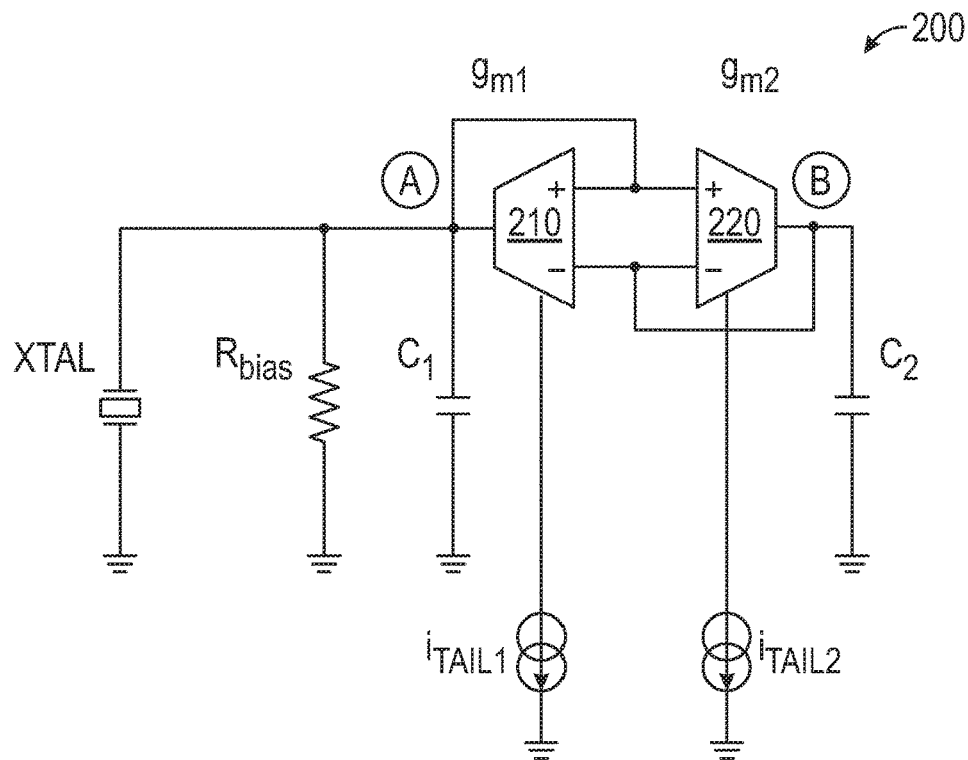
FIG. 2 is a diagram that illustrates a first example configuration of a van den Homberg one-pin oscillator, such as may be used in the architecture of FIG. 1, in accordance with various representative embodiments.
Figure 3:
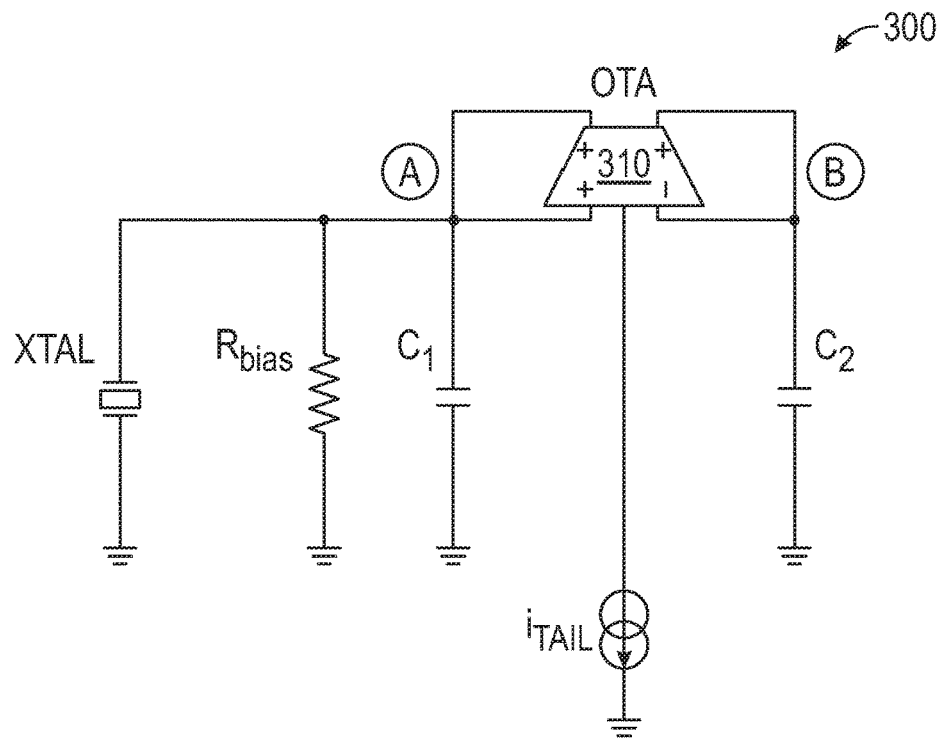
FIG. 3 is a diagram of an alternative configuration of a van den Homberg one-pin oscillator, such as may be used in the architecture of FIG. 1, in accordance with various representative embodiments.
Figure 4:
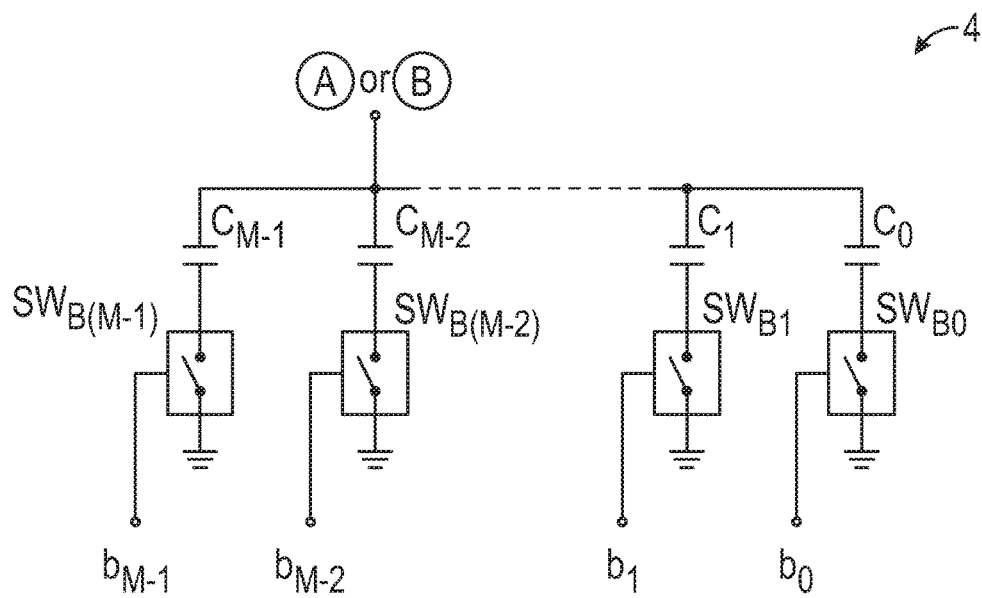
FIG. 4 is a diagram of an example implementation of a digitally-programmable oscillator capacitor, such as may be used in the circuits of FIGS. 2 and 3, in accordance with various representative embodiments.
Figure 5:
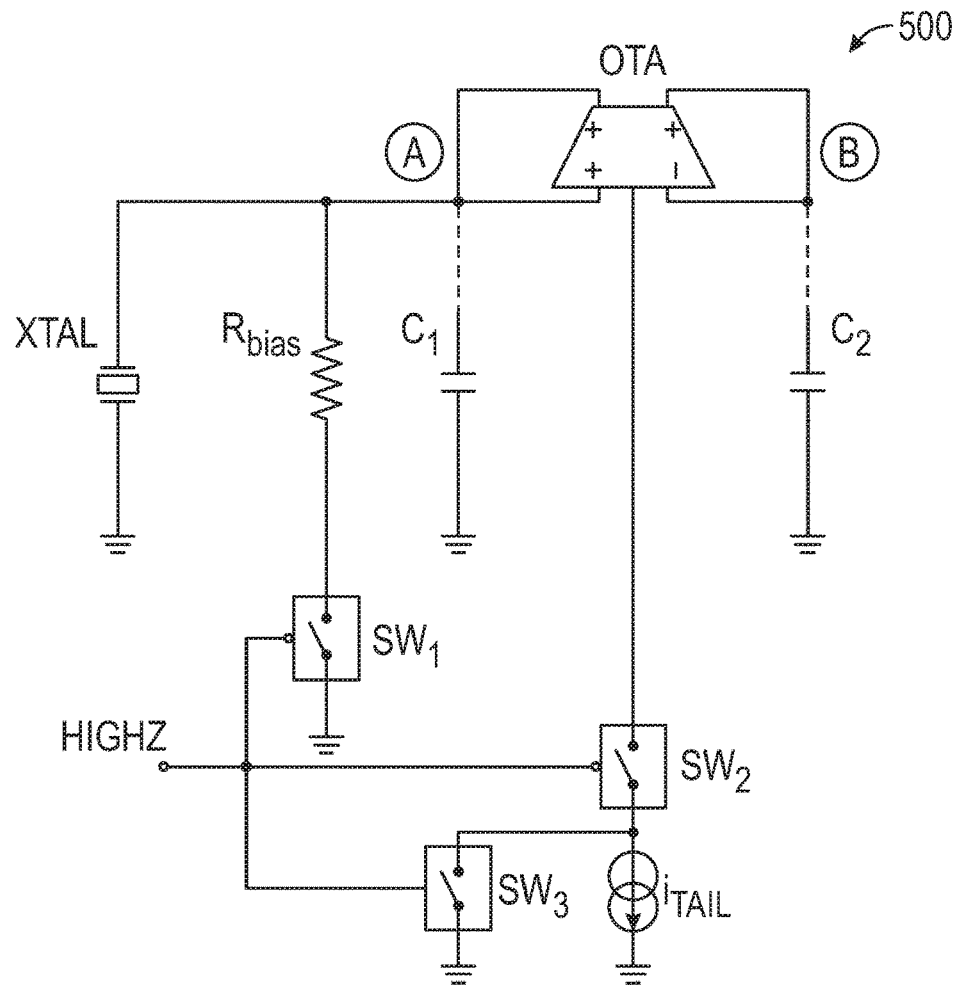
FIG. 5 is a diagram of an example implementation of high-impedance (high-Z) mode for the oscillator of FIG. 3, in accordance with various representative embodiments.

FIG. 2 shows an example diagram 200 of a single-pin crystal oscillator under test that employs van den Homberg architecture using two transconductors 210, 220 as active elements of oscillator core 110. FIG. 3 shows an alternative representation 300 of the oscillator in FIG. 2, using an operational transconductance amplifier (OTA) 310 as an active element of oscillator core 110. Both of these architectures in FIGS. 2 and 3 employ programmable oscillator capacitors $C_1$, $C_2$ of the type shown in diagram 400 of FIG. 4. FIG. 5 shows a circuit 500 that illustrates a control scheme for putting the active core of the oscillator in FIG. 3 (OTA 310 including the bias resistance $R_{bias}$ on the crystal side) in high-Z mode, thereby allowing for testing of programmable oscillator capacitors $C_1$, $C_2$ as described for FIG. 1.

Figure 6:
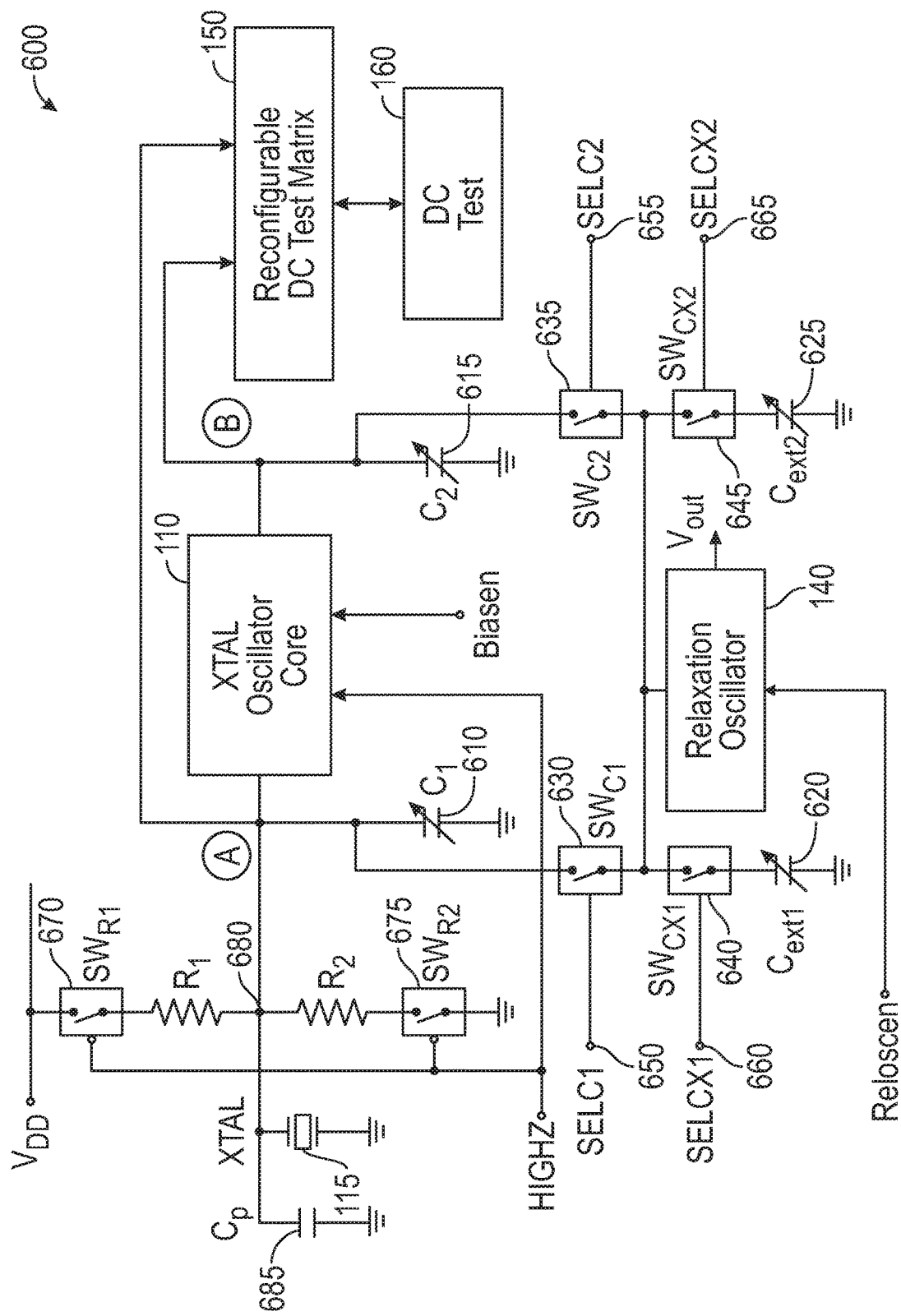
FIG. 6 is a diagram that illustrates an example reconfigurable capacitor connection matrix, in accordance with various representative embodiments.
Figure 7:
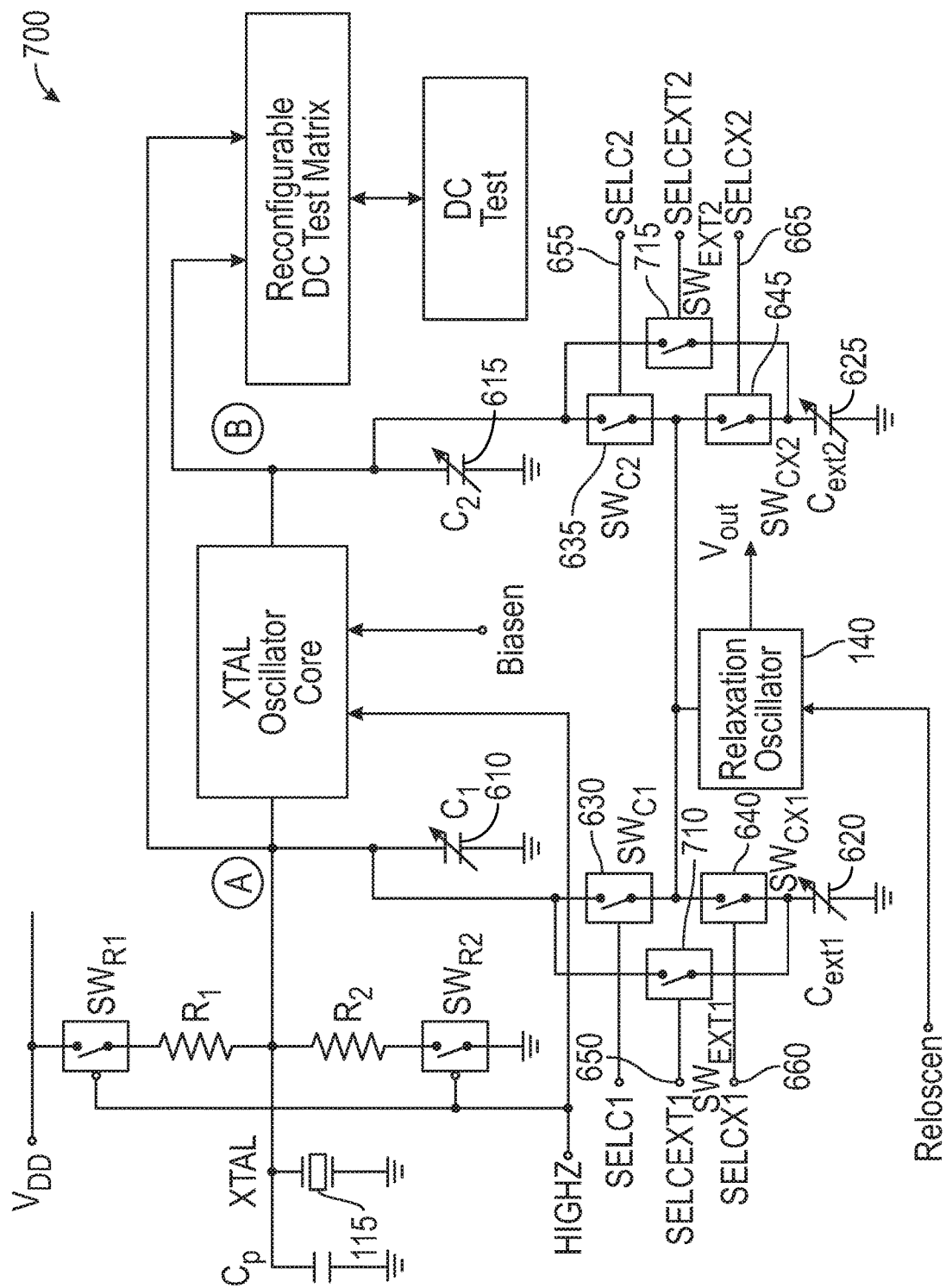
FIG. 7 illustrates a detailed implementation of the reconfigurable capacitor connection matrix, in accordance with various representative embodiments.
Figure 8:
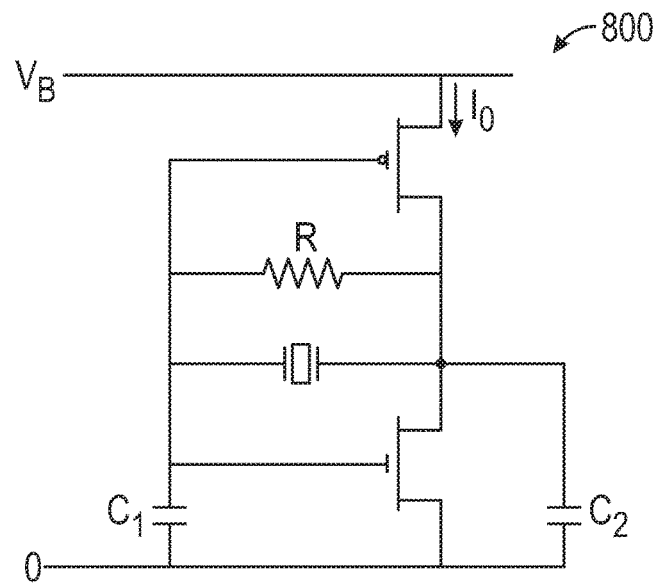
FIG. 8 is a diagram that illustrates a CMOS-inverter crystal oscillator, in accordance with various representative embodiments.

FIGS. 6 and 7 illustrate examples of the reconfigurable capacitor connection matrix 130 in FIG. 1, which operates in conjunction with the high-Z mode of the crystal oscillator core 110. Programmable oscillator capacitors $C_1$ 610 and $C_2$ 615 of block diagram 600 are of the type shown in FIG. 4, and may play the role of $C_1$, $C_2$, respectively, in FIG. 2 or 3. Programmable oscillator capacitors Cext1 620 and Cext2 625 are also of the type shown in FIG. 4, but are not associated with the oscillator under test comprised of oscillator core 110 and oscillator capacitors 120; instead, they may be external capacitors $C_1$, $C_2$, respectively, of a different oscillator present on the same chip (IC), such as the simple CMOS-inverter crystal oscillator 800 shown in FIG. 8, possibly operating at orders of magnitude different relative to the oscillator under test, such as, for example, 32 KHz relative to 32 MHz.

Diagram 600 of FIG. 6 illustrates a detailed example implementation of the reconfigurable capacitor connection matrix, operating in conjunction with the high-Z mode of the crystal oscillator core, for capacitor testing using the relaxation oscillator in FIG. 1. In FIG. 6, oscillator capacitors $C_1$ 610, $C_2$ 615 are in turn connected to a relaxation oscillator 140 via switches $SW_{c1}$ 630 and $SW_{c2}$ 635, respectively, which each serve, when connected, as the only capacitance associated with the relaxation oscillator 140. External capacitors Cext1 620 and Cext1 625 are connected to the relaxation oscillator 140 via switches $SW_{cx1}$ 640 and $SW_{cx2}$ 645, respectively. Switches $SW_{c1}$ 630, $SW_{c2}$ 635, $SW_{cx1}$ 640, $SW_{cx2}$ 645 are controlled by non-overlapping digital control signals $SEL_{C1}$ 650, $SEL_{C1}$ 655, $SEL_{CX1}$ 660, and $SEL_{CX2}$ 665, respectively, provided by digital control 170.

Referring now to the diagram of FIG. 7, a detailed implementation of the reconfigurable capacitor connection matrix is shown. In this example, the reconfigurable capacitor connection matrix operates in conjunction with the high-Z mode of the crystal oscillator core, for capacitor testing using the relaxation oscillator in FIG. 1, with the possibility of connecting additional capacitors in parallel with the original capacitors of the oscillator for inhibiting the oscillation under DC test. In the block diagram 700, external capacitors Cext1 620 and Cext2 625 can be connected in parallel with capacitors $C_1$ 610, $C_2$ 615, respectively, via switches $SW_{cext1}$ 710, $SW_{cext2}$ 715, which are controlled by digital control signals SELCEXT1, SELCEXT2 as shown, for the purpose of inhibiting the oscillation of XTAL 115 during DC test. Further, the high-Z functionality used to test functionality of programmable oscillator capacitors may be implemented using switches $SW_{R1}$ 670 and $SW_{R2}$ 675, which disconnect the resistive divider $R_1$, $R_2$ 680 from the supply and ground nodes, operating in conjunction with a high-Z control scheme such as illustrated in FIG. 5 for the crystal oscillator core 110. A parasitic capacitance $C_P$ 685, which may be associated with the crystal package, chip package, ESD protection circuits, or printed circuit board, is shown in parallel with the crystal XTAL 115.

Figure 9:
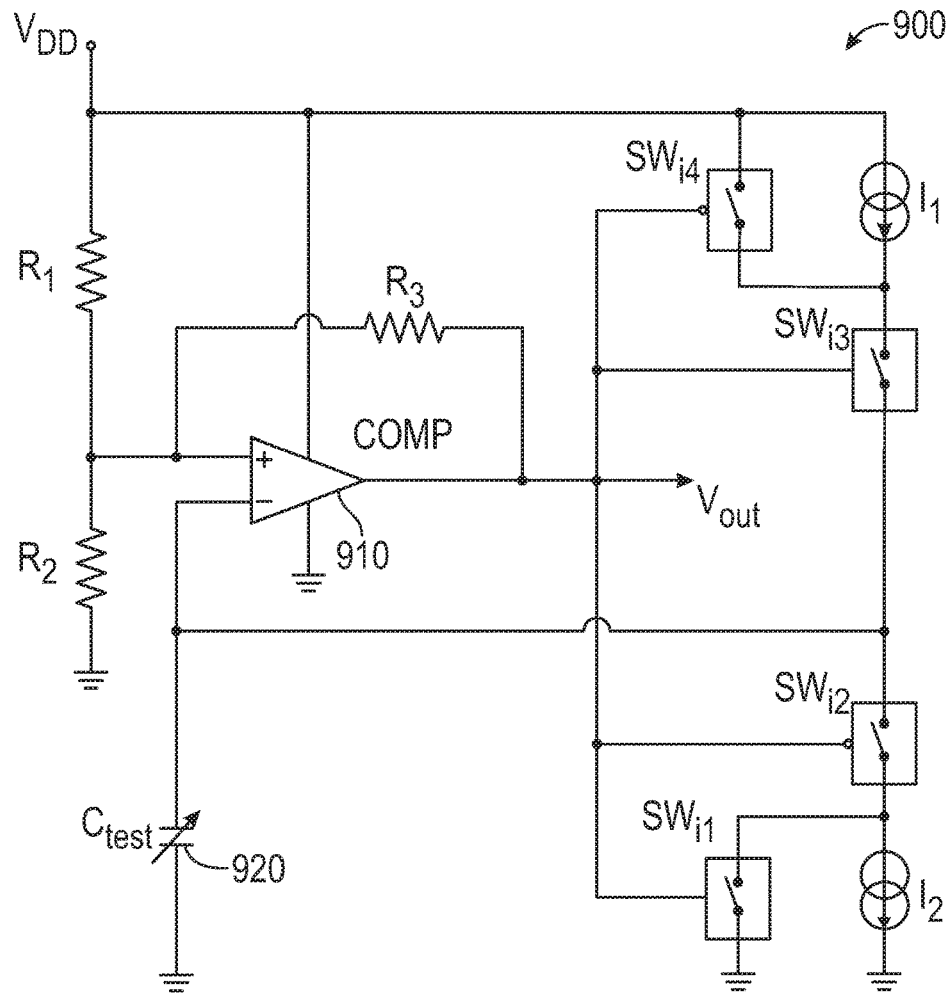
FIG. 9 is a diagram that illustrates a detailed, example circuit configuration for the relaxation oscillator in FIG. 1, 6, or 7, in accordance with various representative embodiments.
Figure 10:
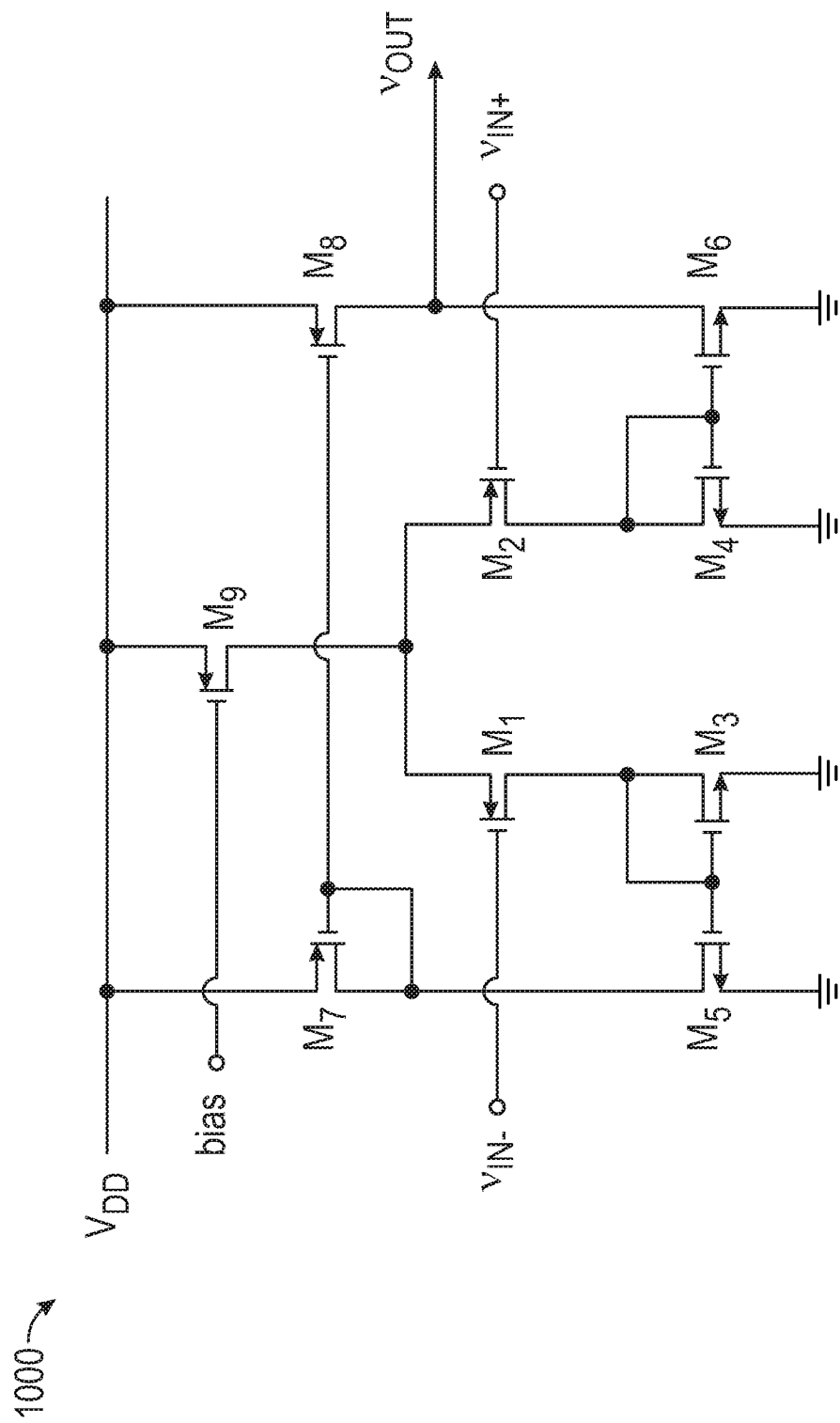
FIG. 10 is a diagram that illustrates an example CMOS detailed circuit configuration for comparator COMP in FIG. 9, in accordance with various representative embodiments.
Figure 11:
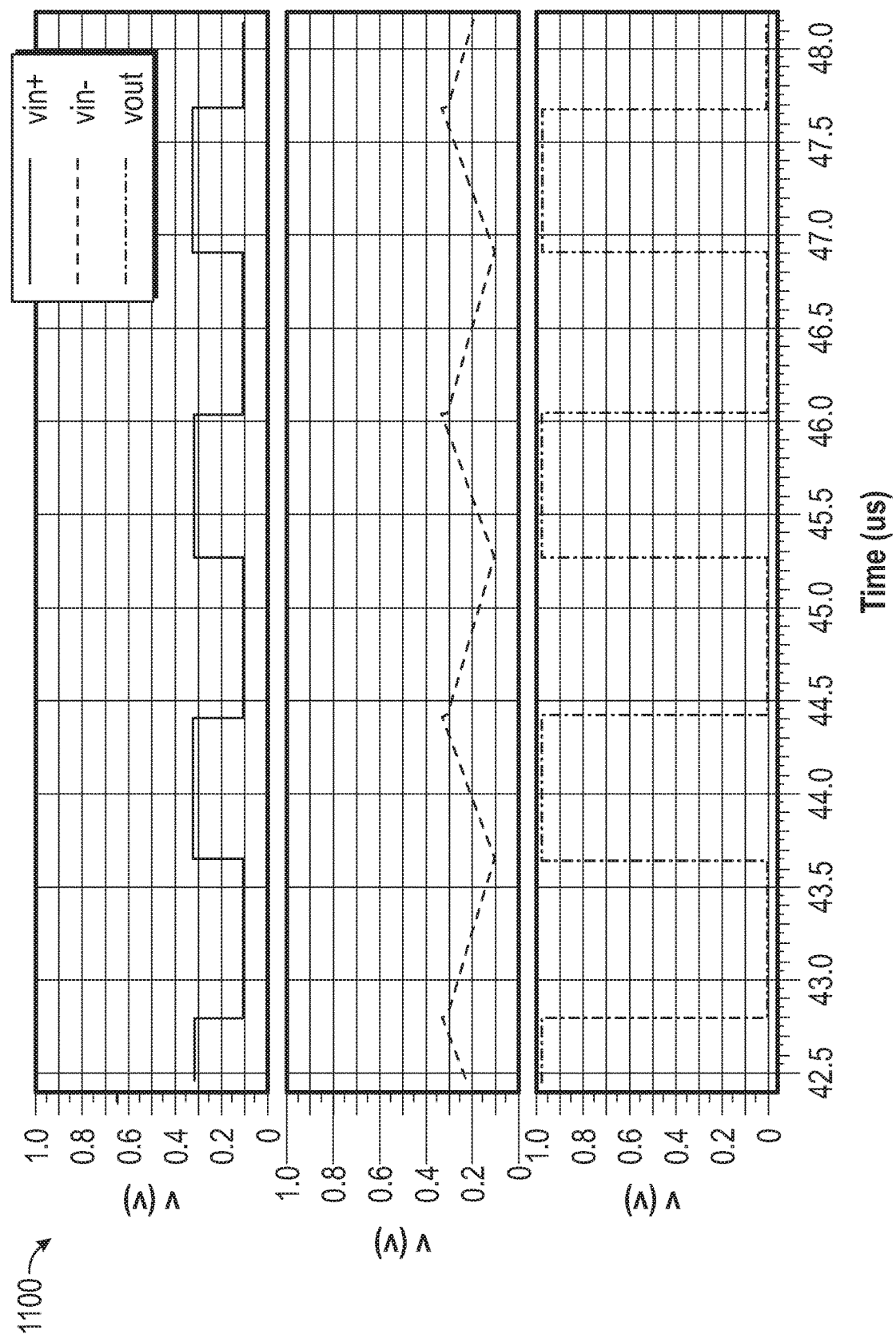
FIG. 11 shows example plots of voltage waveforms associated with the relaxation oscillator of FIG. 9, using a comparator COMP such as in FIG. 10, in accordance with various representative embodiments.

An example implementation of the relaxation oscillator 140 in FIG. 1, 6, or 7 is shown in block diagram 900 of FIG. 9. The resistor arrangement permits the comparator COMP to operate with input voltage ranges that do not include the $V_{DD/2}$ point, which is advantageous in low-voltage systems in that the internal structure of the comparator 910 can be topologically simple and ensure operation of transistors away from the triode region (in CMOS implementations). $C_{test}$ capacitor 920 is a digitally-programmable test capacitor, as illustrated in FIG. 4, for example. It will be recognized, however, that the functionality of $C_{test}$ can be provided by $C_1$ 610, $C_2$ 615, $C_{ext1}$ 620 or $C_{ext2}$ 625, as previously discussed. The output Vout is received by the digital control block 170. An example CMOS implementation 1000 of comparator COMP of FIG. 9 is shown in FIG. 10. Consider the following example in which $I_1=I_2$ and $V_{DD/2}=0.9$ V in FIG. 9, $R_1=200K\Omega$, $R_2=33.3K\Omega$, and $R_3=100K\Omega$, then the input voltage range for comparator COMP 910 is about [100 mV, 300 mV], as shown in voltage waveform 1100 of FIG. 11, sufficient for maintaining in saturation all MOS transistors in FIG. 10 (including tail bias transistor $M_9$).

Figure 12:
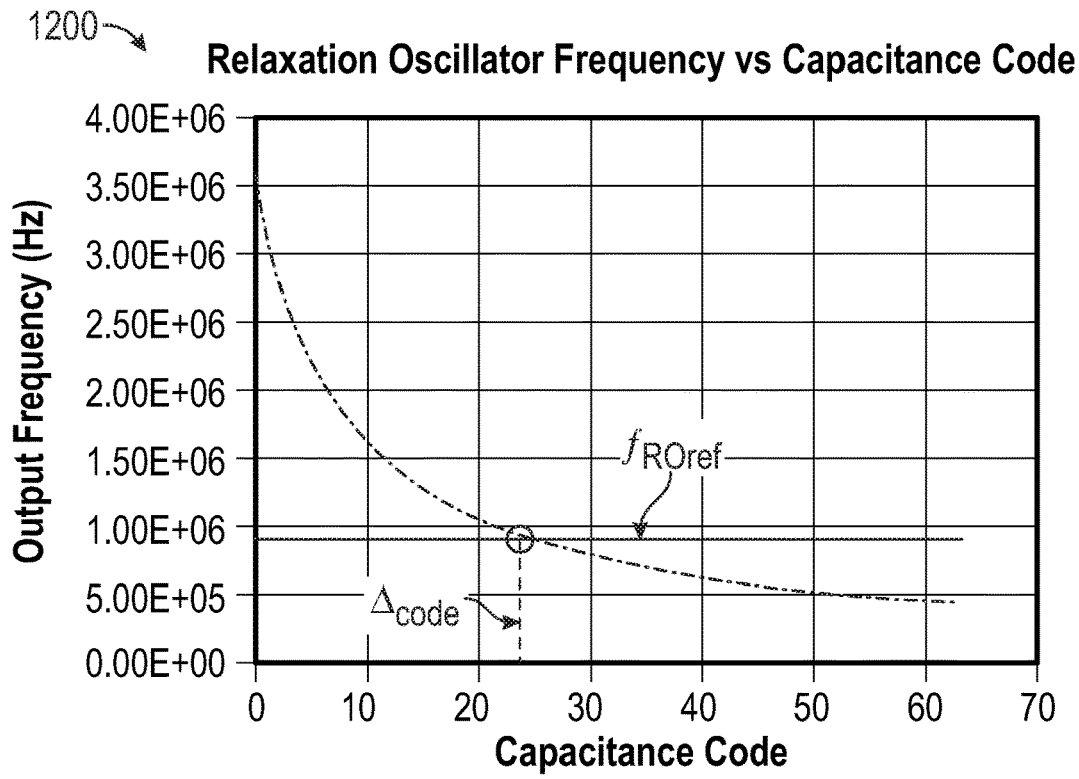
FIG. 12 shows an example waveform plot of the oscillation frequency of the relaxation oscillator in FIG. 9, in accordance with various representative embodiments.

FIG. 12 illustrates an example plot 1200 of the oscillation frequency of relaxation oscillator 900 shown in FIG. 9, using a digitally-programmable test capacitor $C_{test}$ 920 as may be provided by FIG. 4, as a function of the capacitance code. The smoothness and monotonicity of this plot are indicators of the correct performance of the capacitor banks $C_1$, $C_2$ associated with the crystal oscillator under test. Because the relaxation oscillator of FIG. 9 is used in the BIST system of FIG. 6 or 7, it is understood that the role of $C_{test}$ 920 in FIG. 9 can be taken by either $C_1$, $C_2$, $C_{ext1}$, or $C_{ext2}$ in FIGS. 6, 7, as has been previously described.

In addition to the stand-alone evaluation of the capacitor banks, recording the output frequency of the relaxation oscillator under different scenarios permits the calibration of $C_1$, $C_2$ in FIGS. 6, 7 for correct oscillator operation. This calibration may be performed using the following example methodology:

1. Select $C_1$ 610 for the relaxation oscillator 140 by closing $sw_{c1}$ 630 and opening all other switches 635, 640, 645, 670, 675.
2. Set the capacitor code for $C_1$ 610 to zero. Referring to FIG. 4, set $bit_{M-1}=B_{M-2}=\ldots=b_1=b_0=0$; in this way, only $C_p$ 685 and the minimum parasitics associated with $C_1$ 610 appear in the circuit 600.
3. Measure the frequency of the relaxation oscillator $f_{ROref}$ using the minimal capacitor code value for $C_1$. This measurement can be performed by digital control block 170.
4. Next, select $C_2$ 615 for the relaxation oscillator by closing $sw_{c2}$ 635 and opening all otherswitches 630, 640, 645, 670, 675.
5. Sweep the digital capacitor code ($\Delta_{code}$), the decimal equivalent of $b_{M-1}\ldots b_1 b_0$ for $C_2$ 615 from zero to the maximum value, and measure the frequency of the relaxation oscillator 140 at points during the sweep, up to every point.
6. Pick the digital capacitor code ($\Delta_{code}$) where the frequency of the relaxation oscillator 140 is approximately equal to $f_{ROref}$. It may be desirable to dial back the digital capacitor code by a small value—such as 1 or 2—to provide margin over process, voltage, and temperature parameters.
7. This decimal code ($\Delta_{code}$) is the code that makes $C_2$ approximately equal to $C_P$ plus the minimum parasitics of $C_1$ on the crystal side. It is also the code offset that should preferably be maintained between the decimal capacitor codes $C_{1code}$ and $C_{2code}$. $C_{1code}$ and $C_{2code}$ correspond to $C_1$ and $C_2$, respectively, for correct oscillator operation when $C_1$ is adjusted for frequency tuning (i.e., the relationship $C_{2code}=C_{1code}+\Delta_{code}$ is preferably maintained).

Figure 13:
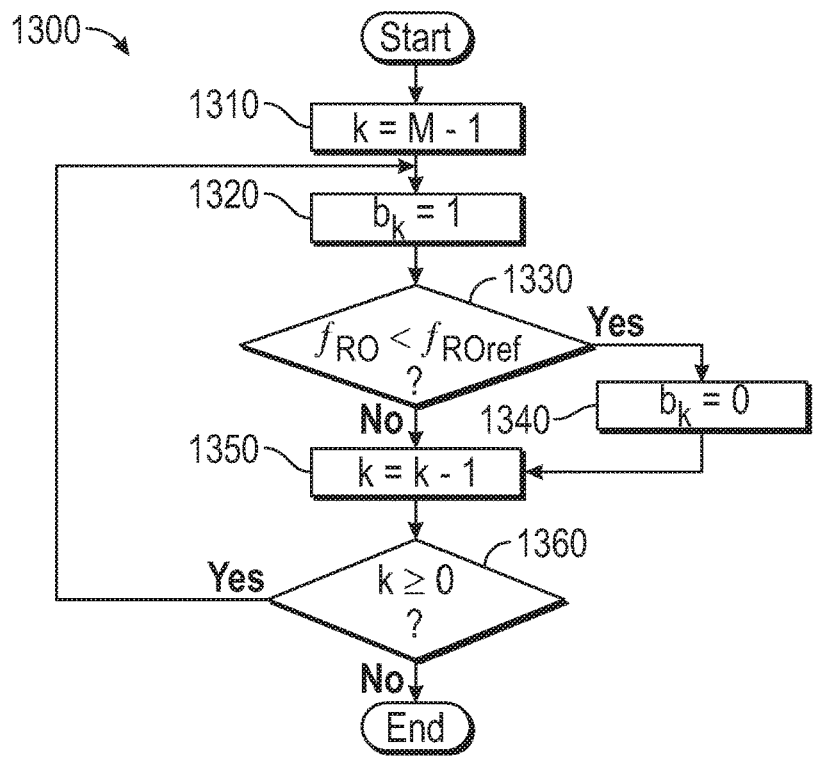
FIG. 13 shows an example implementation of a binary search methodology for finding the capacitance code corresponding to frequency $f_{ROref}$ in FIG. 12, in accordance with various representative embodiments.

Alternatively, the binary equivalent of $\Delta_{code}$ above can be found using a binary search methodology, such as the example binary search flow 1300 shown in FIG. 13. The capacitance code corresponding to frequency $f_{ROref}$ in FIG. 12 can be found using a digitally-programmable test capacitor Crest such as that described in connection with FIG. 4. This approach has the advantage of a potentially much reduced test time required to find the binary equivalent of $\Delta_{code}$ compared to the above methodology. At block 1310 k=M-1 and at block 1320 $b_K=1$. The inquiry at decision block 1330 is whether $f_{RO}<f_{ROref}$. If yes, then $b_K=0$ at block 1340; if no, then $b_K$ remains unchanged: $b_K=1$. At block 1350, k=k-1 and the flow continues to decision block 1360. If k>=0 then the flow returns to block 1320. From this example flow, it can be seen that a binary search methodology for finding the capacitance code corresponding to frequency $f_{ROref}$ in FIG. 12 is provided.

Figure 14:
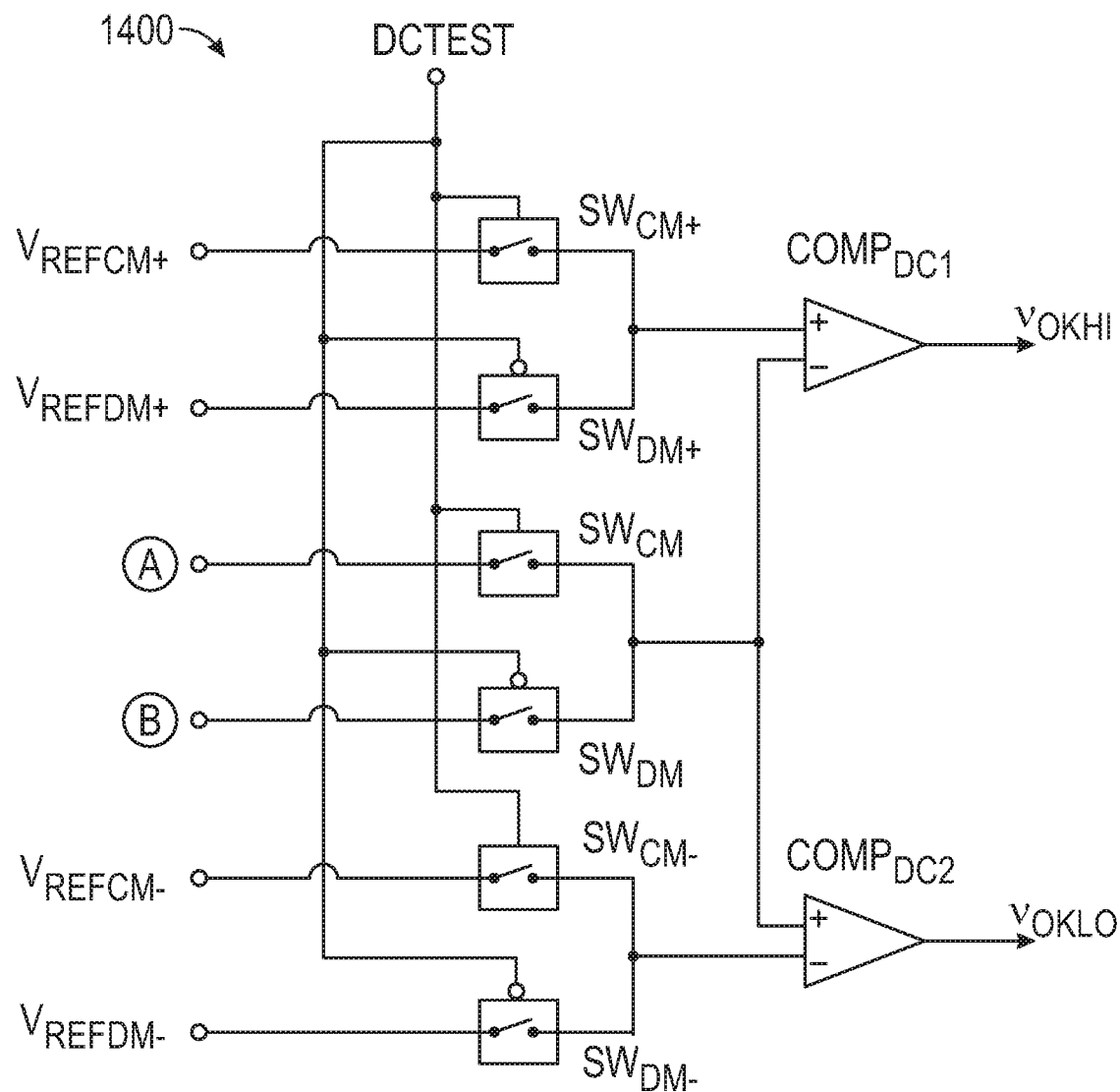
FIG. 14 is a diagram that illustrates an example implementation of the reconfigurable DC test matrix and the DC test block in FIG. 1, 6, or 7, in accordance with various representative embodiments.

Turning again to the testing of active components of XTAL oscillator core 110, block diagram 1400 of FIG. 14 shows a detailed example implementation of the reconfigurable DC test matrix and the DC test block in FIG. 1, 6, or 7. Some or all of the capacitors associated with the oscillator assume their maximum values in order to inhibit and hopefully prevent oscillations from initiating in the oscillator during the DC test. Preferably all capacitors, even external capacitors $C_{ext1}$ and $C_{ext2}$ shown explicitly in FIGS. 6, 7 may also be connected if available, so as to prevent oscillations from initiating in the oscillator during the DC test. Digital control signal DCTEST=1 selects the common-mode test; DCTEST=0 selects the differential-mode test. For DCTEST=1, the DC voltage of node A of the oscillator shown in FIG. 2, 3, 5, 6, or 7 is compared against the limits $V_{REFCM+}$ and $V_{REFCM-}$. If the voltage is between $V_{REFCM+}$ and $V_{REFCM-}$, the outputs of comparators $COMP_{DC1}$ and $COMP_{DC2}$ are high, indicating correct operation. Similarly, for DCTEST=0, the DC voltage of node B of the oscillator shown in FIG. 2, 3, 5, 6, or 7 is compared against the limits $V_{REFDM+}$ and $V_{REFDM-}$; where $V_{REFDM+}$ and $V_{REFDM-}$ are now pegged to the voltage $V_A$ of node A, for example $V_{REFDM+}=V_A+\Delta V_{DM}$, $V_{REFDM-}=V_A-\Delta V_{DM}$, and $\Delta V_{DM}$ is consistent with the relatively small offset values appearing in the normal operation of a differential transconductor or OTA. If the voltage is between $V_{REFDM+}$ and $V_{REFDM-}$, the outputs of comparators $COMP_{DC1}$ and $COMP_{DC2}$ are high, indicating correct operation.

In view of the foregoing, a built-in self-test (BIST) methodology and the associated test hardware for low-voltage crystal oscillators, such as single-pin crystal oscillators, are disclosed. An example oscillator configuration covered by the method and disclosed herein is the van den Homberg architecture, but other configurations, such as that illustrated in FIG. 8, for example, can also be tested and/or calibrated. The methodology presented herein therefore covers the separate evaluation of the essential building blocks of the oscillator, such as passive capacitor banks and active transconductors, and also provides a calibration approach for ensuring oscillation at the correct frequency with minimum start-up time over the desired tuning range (i.e., for all possible values of the crystal load capacitance), regardless of the capacitive parasitics affecting the integrated circuit (due to the crystal package, chip package, ESD protection circuits, or printed circuit board). For capacitor testing and calibration, the method relies on using the capacitor banks of the oscillator under test in a separate on-chip relaxation oscillator operating at different frequencies compared to the main crystal oscillator, using digitally-controlled reconfigurable matrices and dedicated circuitry for the relaxation oscillator, while the active oscillator core is in a high-impedance mode. The BIST system can also test other on-chip capacitors not normally associated with the single-pin crystal oscillator under test, by additional connections established in the reconfigurable matrices. The evaluation of the health of the oscillator active core (comprising, for example, transconductors) is done indirectly by maintaining the core in the normal mode while setting capacitors to their maximum value, which inhibits any oscillation from initiating, and monitoring the appropriate bias (DC) voltages in the core for correct values. Relevant circuit implementations used in the BIST system are also disclosed.

Those skilled in the art will recognize that the present disclosure has been described in terms of example embodiments based upon use of a programmed processor. However, the invention should not be so limited, since the present disclosure could be implemented using hardware component equivalents such as special purpose hardware and/or dedicated processors which are equivalents to the disclosure as described and claimed. Similarly, general purpose computers, microprocessor based computers, micro-controllers, optical computers, analog computers, dedicated processors and/or dedicated hard wired logic may be used to construct alternative equivalent embodiments of the present disclosure.

Moreover, those skilled in the art will appreciate that a program flow and associated data used to implement the embodiments described above can be implemented using various forms of storage such as Read Only Memory (ROM), Random Access Memory (RAM), Electrically Erasable Programmable Read Only Memory (EEPROM); non-volatile memory (NVM); mass storage such as a hard disc drive, floppy disc drive, optical disc drive; optical storage elements, magnetic storage elements, magneto-optical storage elements, flash memory, core memory and/or other equivalent storage technologies without departing from the present disclosure. Such alternative storage devices should be considered equivalents.

Various embodiments described herein are implemented using programmed processors executing programming instructions that are broadly described in flow chart form that can be stored on any suitable electronic storage medium or transmitted over any suitable electronic communication medium. However, those skilled in the art will appreciate that the processes described above can be implemented in any number of variations and in many suitable programming languages without departing from the present disclosure. For example, the order of certain operations carried out can often be varied, additional operations can be added or operations can be deleted without departing from the disclosure. Error trapping can be added and/or enhanced and variations can be made in user interface and information presentation without departing from the present disclosure. Such variations are contemplated and considered equivalent.

The representative embodiments, which have been described in detail herein, have been presented by way of example and not by way of limitation. It will be understood by those skilled in the art that various changes may be made in the form and details of the described embodiments resulting in equivalent embodiments that remain within the scope of the appended claims.

Accordingly, some aspects and features of the disclosed embodiments are set out in the following numbered items:

1. A built-in self-test (BIST) apparatus of an integrated circuit, comprising: a reconfigurable capacitor connection matrix; a relaxation oscillator, operable to generate a frequency different from a frequency generated by an oscillator of the integrated circuit, the relaxation oscillator coupled to one or more of a plurality of programmable oscillator capacitors of the oscillator and an oscillator core of the oscillator via the reconfigurable capacitor connection matrix and an output of the relaxation oscillator coupled to the reconfigurable capacitor connection matrix; and a control element coupled to and operable to control the reconfigurable capacitor connection matrix and the relaxation oscillator; where functionality of one or more of the plurality of programmable oscillator capacitors of the oscillator is tested by placement of the oscillator core of the integrated circuit into a high-impedance mode by the control element and measurement of the frequency of the relaxation oscillator as a function of a plurality of programming codes applied to the one or more of the plurality of programmable oscillator capacitors by the reconfigurable capacitor connection matrix.

2. The apparatus of item 1, where functionality of one or more of a second plurality of programmable oscillator capacitors of a second oscillator of the integrated circuit is tested by placement of a second oscillator core of the second oscillator of the integrated circuit into a high-impedance mode by the control element and recordation of the frequency of the relaxation oscillator as a function of a programming code applied to the one or more of the second plurality of programmable oscillator capacitors via the reconfigurable capacitor connection matrix, the second plurality of programmable oscillator capacitors of the second oscillator of the integrated circuit external to the plurality of oscillator capacitors of the oscillator.

3. The apparatus of item 2, where the second oscillator operates at a frequency different from the first oscillator.

4. The apparatus of item 2, where the second oscillator is a CMOS-inventor crystal oscillator.

5. The apparatus of item 1, where the relaxation oscillator generates a signal at a frequency different from the frequency generated by a resonator of the oscillator.

6. The apparatus of item 5, where the resonator is a single-pin resonator.

7. The apparatus of item 5, where the relaxation oscillator generates a signal at a frequency of approximately 1 MHz and the frequency of the resonator is approximately 32 MHz.

8. The apparatus of item 1 where the relaxation oscillator further comprises: a plurality of resistors; a comparator coupled to the plurality of resistors at a first input and an output; and a programmable test capacitor coupled to a second input of the comparator.

9. The apparatus of item 8, where the comparator is CMOS and the input voltage range for the comparator is sufficient to maintain a plurality of MOS transistors of the comparator in saturation.

10. The apparatus of item 9, where the plurality of resistors are arranged to permit the comparator to operate with input voltage ranges exclusive of high voltage VDD/2.

11. The apparatus of item 1, where the measured frequencies of the relaxation oscillator as a function of the plurality of programming codes applied to the one or more programmable oscillator capacitors are recorded.

12. The apparatus of item 1, where the control element is a digital control element.

13. A built-in self-test (BIST) method for testing an integrated circuit oscillator circuit topology, comprising: testing functionality of one or more of a plurality of programmable oscillator capacitors of an oscillator of an integrated circuit by: placing an oscillator core of the oscillator into a high-impedance mode, the oscillator core coupled to one or more of the plurality of programmable oscillator capacitors of the oscillator via a reconfigurable capacitor connection matrix; and measuring the frequency of a relaxation oscillator as a function of a plurality of programming codes applied to the one or more of the plurality of programmable oscillator capacitors via the reconfigurable capacitor connection matrix, the relaxation oscillator coupled to the plurality of programmable oscillator capacitors by the reconfigurable capacitor connection matrix.

14. The method of item 13, further comprising connecting the one or more of the plurality of programmable oscillator capacitors to the relaxation oscillator by the reconfigurable capacitor connection matrix.

15. The method of item 14, where connecting the one or more of the plurality of programmable oscillator capacitors to the relaxation oscillator further comprises selectively controlling switching elements of the reconfigurable capacitor connection matrix to select and couple the one or more of the plurality of programmable oscillator capacitors to the relaxation oscillator.

16. The method of item 13, further comprising testing functionality of a second plurality of programmable oscillator capacitors of a second oscillator of the integrated circuit by: placing the second oscillator core of the integrated circuit into a high-impedance mode, the second oscillator core coupled to the second plurality of programmable oscillator capacitors via the reconfigurable capacitor connection matrix; and measuring the frequency of the relaxation oscillator as a function of a plurality of programming codes applied to the one or more of the second plurality of programmable oscillator capacitors via the reconfigurable capacitor connection matrix, the relaxation oscillator coupled to the second plurality of programmable oscillator capacitors via the reconfigurable capacitor connection matrix.

17. The method of item 16, further comprising recording the frequency of the relaxation oscillator as a function of a plurality of programming codes applied to the one or more of the second plurality of programmable oscillator capacitors.

18. The method of item 16, where the second oscillator operates at a frequency different from the first oscillator.

19. The method of item 13, where measuring the frequency of a relaxation oscillator as a function of a plurality of programming codes applied to the one or more of the plurality of programmable oscillator capacitors further comprises: selecting a first programmable oscillator capacitor of the plurality of programmable oscillator capacitors; setting a capacitor code of the plurality of capacitor codes for the first programmable oscillator capacitor to a minimum value of a range; measuring the frequency of the relaxation oscillator with the capacitor code of the selected first programmable oscillator capacitor set to the minimal value of the range; selecting a second programmable oscillator capacitor of the plurality of programmable oscillator capacitors; setting a capacitor code of the plurality of capacitor codes for the second programmable oscillator capacitor at the minimum value, incrementally changing the capacitor code from the minimum value to a maximum value of the range and measuring the frequency of the relaxation oscillator at each point along the range; determining a value of the capacitor code applied to the second programmable oscillator capacitor that results in the frequency of the relaxation oscillator being approximately that of the frequency of the relaxation oscillator when the minimum value of the capacitor code is applied to the first programmable oscillator capacitor; and applying the determined value of the capacitor code to the second programmable oscillator capacitor to calibrate the second programmable oscillator capacitor.

20. The method of item 19, where selecting the first programmable oscillator capacitor comprises selectively controlling a plurality of switches of the reconfigurable capacitor connection matrix to select the first programmable oscillator capacitor.

21. The method of item 13, further comprising recording the frequency of the relaxation oscillator as a function of a plurality of programming codes applied to the one or more of the second plurality of programmable oscillator capacitors.

The invention claimed is:

1. A built-in self-test (BIST) apparatus of an integrated circuit, comprising:
    a reconfigurable capacitor connection matrix;
    a relaxation oscillator, operable to generate a frequency different from a frequency generated by an oscillator of the integrated circuit, the relaxation oscillator coupled to one or more of a plurality of programmable oscillator capacitors of the oscillator and an oscillator core of the oscillator via the reconfigurable capacitor connection matrix and an output of the relaxation oscillator coupled to the reconfigurable capacitor connection matrix; and
    a control element coupled to and operable to control the reconfigurable capacitor connection matrix and the relaxation oscillator;
    where functionality of one or more of the plurality of programmable oscillator capacitors of the oscillator is tested by placement of the oscillator core of the integrated circuit into a high-impedance mode by the control element and measurement of the frequency of the relaxation oscillator as a function of a plurality of programming codes applied to the one or more of the plurality of programmable oscillator capacitors by the reconfigurable capacitor connection matrix.

2. The apparatus of claim 1, where functionality of one or more of a second plurality of programmable oscillator capacitors of a second oscillator of the integrated circuit is tested by placement of a second oscillator core of the second oscillator of the integrated circuit into a high-impedance mode by the control element and recordation of the frequency of the relaxation oscillator as a function of a programming code applied to the one or more of the second plurality of programmable oscillator capacitors via the reconfigurable capacitor connection matrix, the second plurality of programmable oscillator capacitors of the second oscillator of the integrated circuit external to the plurality of oscillator capacitors of the oscillator.

3. The apparatus of claim 2, where the second oscillator operates at a frequency different from the oscillator.

4. The apparatus of claim 2, where the second oscillator is a CMOS-inventor crystal oscillator.

5. The apparatus of claim 1, where the relaxation oscillator generates a signal at a frequency different from the frequency generated by a resonator of the oscillator.

6. The apparatus of claim 5, where the resonator is a single-pin resonator.

7. The apparatus of claim 5, where the relaxation oscillator generates a signal at a frequency of approximately 1 MHz and the frequency of the resonator is approximately 32 MHz.

8. The apparatus of claim 1 where the relaxation oscillator further comprises:
a plurality of resistors;
a comparator coupled to the plurality of resistors at a first input and an output; and
a programmable test capacitor coupled to a second input of the comparator.

9. The apparatus of claim 8, where the comparator is CMOS and the input voltage range for the comparator is sufficient to maintain a plurality of MOS transistors of the comparator in saturation.

10. The apparatus of claim 9, where the plurality of resistors is arranged to permit the comparator to operate with input voltage ranges exclusive of high voltage VDD/2.

11. The apparatus of claim 1, where the measured frequencies of the relaxation oscillator as a function of the plurality of programming codes applied to the one or more programmable oscillator capacitors are recorded.

12. The apparatus of claim 1, where the control element is a digital control element.

13. A built-in self-test (BIST) method for testing an integrated circuit oscillator circuit topology, comprising:
testing functionality of one or more of a plurality of programmable oscillator capacitors of an oscillator of an integrated circuit by:
placing an oscillator core of the oscillator into a high-impedance mode, the oscillator core coupled to one or more of the plurality of programmable oscillator capacitors of the oscillator via a reconfigurable capacitor connection matrix; and
measuring the frequency of a relaxation oscillator as a function of a plurality of programming codes applied to the one or more of the plurality of programmable oscillator capacitors via the reconfigurable capacitor connection matrix, the relaxation oscillator coupled to the plurality of programmable oscillator capacitors by the reconfigurable capacitor connection matrix.

14. The method of claim 13, further comprising selectively connecting the one or more of the plurality of programmable oscillator capacitors to the relaxation oscillator by the reconfigurable capacitor connection matrix.

15. The method of claim 14, where connecting the one or more of the plurality of programmable oscillator capacitors to the relaxation oscillator further comprises selectively controlling switching elements of the reconfigurable capacitor connection matrix to select and couple the one or more of the plurality of programmable oscillator capacitors to the relaxation oscillator.

16. The method of claim 13, further comprising testing functionality of a second plurality of programmable oscillator capacitors of a second oscillator of the integrated circuit by:
placing the second oscillator core of the integrated circuit into a high-impedance mode, the second oscillator core coupled to the second plurality of programmable oscillator capacitors via the reconfigurable capacitor connection matrix; and
measuring the frequency of the relaxation oscillator as a function of a plurality of programming codes applied to the one or more of the second plurality of programmable oscillator capacitors via the reconfigurable capacitor connection matrix, the relaxation oscillator coupled to the second plurality of programmable oscillator capacitors via the reconfigurable capacitor connection matrix.

17. The method of claim 16, further comprising recording the frequency of the relaxation oscillator as a function of a plurality of programming codes applied to the one or more of the second plurality of programmable oscillator capacitors.

18. The method of claim 16, where the second oscillator operates at a frequency different from the oscillator.

19. The method of claim 13, where measuring the frequency of a relaxation oscillator as a function of a plurality of programming codes applied to the one or more of the plurality of programmable oscillator capacitors further comprises:
selecting a first programmable oscillator capacitor of the plurality of programmable oscillator capacitors;
setting a capacitor code of the plurality of capacitor codes for the first programmable oscillator capacitor to a minimum value of a range;
measuring the frequency of the relaxation oscillator with the capacitor code of the selected first programmable oscillator capacitor set to the minimal value of the range;
selecting a second programmable oscillator capacitor of the plurality of programmable oscillator capacitors;
setting a capacitor code of the plurality of capacitor codes for the second programmable oscillator capacitor at the minimum value, incrementally changing the capacitor code from the minimum value to a maximum value of the range and measuring the frequency of the relaxation oscillator at each point along the range;
determining a value of the capacitor code applied to the second programmable oscillator capacitor that results in the frequency of the relaxation oscillator being approximately that of the frequency of the relaxation oscillator when the minimum value of the capacitor code is applied to the first programmable oscillator capacitor; and
applying the determined value of the capacitor code to the second programmable oscillator capacitor to calibrate the second programmable oscillator capacitor.

20. The method of claim 19, where selecting the first programmable oscillator capacitor comprises selectively controlling a plurality of switches of the reconfigurable capacitor connection matrix to select the first programmable oscillator capacitor.

21. The method of claim 13, further comprising recording the frequency of the relaxation oscillator as a function of a plurality of programming codes applied to the one or more of a second plurality of programmable oscillator capacitors.

* * * * *